United States Patent [19]

Gadgil

[11] Patent Number: 5,284,519
[45] Date of Patent: Feb. 8, 1994

[54] INVERTED DIFFUSER STAGNATION POINT FLOW REACTOR FOR VAPOR DEPOSITION OF THIN FILMS

[75] Inventor: Prasad N. Gadgil, Burnaby, Canada

[73] Assignee: Simon Fraser University, Canada

[21] Appl. No.: 701,525

[22] Filed: May 16, 1991

[30] Foreign Application Priority Data

May 16, 1990 [CA] Canada ................................ 2016970

[51] Int. Cl.[5] ........................................... C23C 16/00
[52] U.S. Cl. .................................. 118/719; 118/715; 118/725; 118/728; 156/611; 156/613
[58] Field of Search ............... 118/715, 725, 728, 719; 156/613, 611

[56] References Cited

U.S. PATENT DOCUMENTS

| | | | |
|---|---|---|---|
| 3,391,270 | 7/1968 | Harris | 118/725 |
| 4,565,157 | 1/1986 | Brors | 118/725 |
| 4,650,539 | 3/1987 | Irvine | 118/725 |
| 4,732,110 | 3/1988 | Parsons | 156/613 |
| 4,774,416 | 9/1988 | Askary | 118/715 |
| 4,798,165 | 1/1989 | deBoer et al. | |
| 4,817,558 | 4/1989 | Itoh | 118/725 |
| 4,825,809 | 5/1989 | Mieno | 118/715 |
| 4,911,102 | 3/1990 | Manabe | 118/715 |
| 4,980,204 | 12/1990 | Fujii | 118/725 |
| 5,000,113 | 3/1991 | Wang | 118/725 |

FOREIGN PATENT DOCUMENTS

| | | | |
|---|---|---|---|
| 3715644 | 12/1988 | Fed. Rep. of Germany . | |
| 63-64322 | 3/1988 | Japan | 118/715 |
| 63-199432 | 8/1988 | Japan | 118/715 |
| 64-82614 | 3/1989 | Japan | 118/715 |
| 2-102200 | 4/1990 | Japan | 156/613 |
| 2-117128 | 5/1990 | Japan | 156/613 |
| WO90/10092 | 9/1990 | PCT Int'l Appl. . | |

OTHER PUBLICATIONS

Matsumoto, J. Crystal Growth 77 (1986) 151-156.
H. M. Cox et al., Vapor Levitation Epitaxy: System Design and Performance, Journal of Crystal Growth, vol. 79, 1986, pp. 900-908.
P. Lee et al., MOCVD in an Inverted Stagnation Point Flow, Journal of Crystal Growth, vol. 77, 1986, pp. 120-127.
A. G. Thompson et al., Growth of GaAs in a Rotating Disk MOCVD Reactor, Journal of Crystal Growth, vol. 94, 1989, pp. 901-910.
A. Sherman, Modeling of Chemical Vapor Deposition Reactors, Journal of Electronic Materials, vol. 17, No. 5, 1988, pp. 413-423.
K. F. Jensen, Modeling of Chemical Vapor Deposition Reactors, Proc. of 9th Intl. Conf. on CVD, pp. 3-20, Med. Robinson, G. W. Cullen, C. H. J. van den Brekel and J. M. Blocher (eds.), The Electrochemical Society Inc., Pennington NJ, U.S.A.
L. M. Fraas et al., Epitaxial Films Grown by Vacuum MOCVD, Journal of Crystal Growth, vol. 68, 1984, pp. 490-496.

Primary Examiner—Richard Bueker
Attorney, Agent, or Firm—Klarquist Sparkman Campbell Leigh & Whinston

[57] ABSTRACT

This invention relates to a novel inverted diffuser stagnation point flow reactor which can be used for vapor deposition of thin solid films on substrates. A metalorganic chemical vapor deposition reactor comprising a gas mixing chamber with gas entry ports into the mixing chamber; a substrate for deposition thereon of solid film; and a gas outlet for conveying gas away from the substrate, characterized by a capillary plug positioned at the base of an inverted diffuser between the mixing chamber and the substrate, the capillary plug serving to streamline the flow of gas to the substrate.

17 Claims, 13 Drawing Sheets

INVERTED DIFFUSER STAGNATION POINT FLOW REACTOR FOR VAPOR DEPOSITION OF THIN FILMS

FIELD OF THE INVENTION

This invention relates to a novel inverted diffuser stagnation point flow reactor which can be used for vapor deposition of thin solid films on substrates.

BACKGROUND OF THE INVENTION

The general purpose of a chemical vapor deposition (CVD) assembly is to deposit thin films of uniform thickness and chemical composition over a large area substrate such as glass, quartz, sapphire, or iron or titanium sheets.

A variety of reactor systems have been conceived and built, over the years, relating to this field, for example, H. M. Cox, S. G. Hummel and V. G. Keramidas, J. Crystal Growth 79, 900–908 (1986); P. Lee, D. McKenna, D. Kapur and K. F. Jensen, J. Crystal Growth, 77, 120–127 (1986); A. G. Thompson, V. S. Sunderam, G. R. Girard and L. M. Fraas, J Crystal Growth, 94, 901–910 (1989); and mathematically analyzed, A. Sherman, J. Electronic materials, 17, 413–423 (1988); K. F. Jensen, Proc. The Ninth Inter. Conf. on CVD, pp. 3–15, Ed. McD. Robinson, G. W. Cullen, C. H. J. van den Brekel and J. M. Blocher, Jr. Electrochem. Soc., 1984; L. M. Fraas, P. S. McLeod, J. A. Cape and L. D. Partain, J. Crystal Growth, 68, 490–496 (1984).

However, in most cases, uniformity in gas flow has been achieved by either applying a vacuum to the device or rotating the substrate at high speed, or by both means. In one design, H. M. Cox et al, uniform upward flow of gas was achieved by means of a porous frit. The gas impinged on the substrate and at the same time held the substrate in levitation over the frit. But this design was beset by the problems of pressure drop across the frit, difficulty in heating the substrate and the possibility of blocking the frit by solid reaction products due to its proximity to the hot substrate.

SUMMARY OF THE INVENTION

This invention pertains to a metalorganic chemical vapor deposition reactor comprising a gas mixing chamber with gas entry ports into the mixing chamber; a substrate for deposition thereon of a thin solid film; and a gas outlet for conveying gas away from the substrate, characterized by a capillary plug positioned between the mixing chamber and the substrate, the capillary plug serving to streamline and equally and evenly distribute the flow of gas to the substrate. The chemical vapor deposition reactor also comprises a gas mixing chamber with gas entry ports into the mixing chamber; a substrate for deposition thereon of a thin solid film; and a gas outlet for conveying gas away from the substrate, characterized by an outwardly expanding chamber positioned between the mixing chamber and the substrate, the outwardly expanding chamber being designed to streamline the flow of gas to the substrate. In the reactor an outwardly expanding chamber can be positioned between the capillary plug and the substrate, the capillary plug and the outwardly expanding chamber cooperating to streamline the flow of gas to the substrate which is heated by an electrical heater.

This invention further pertains to a metal organic chemical vapor deposition reactor comprising a gas mixing chamber with gas entry ports into the mixing chamber; a capillary plug adapted to provide streamlined flow of gas passed through the capillary plug, the capillary plug being connected to the mixing chamber; an outwardly expanding chamber connected to the side of the capillary plug opposite the mixing chamber; a substrate located at the end of the outwardly expanding chamber, opposite to the capillary plug; a heater located proximate to the substrate for heating the substrate to an elevated temperature; and gas outlet ports adapted to convey gas away from the substrate and heater element.

In the reactor a hollow tube can be positioned between and can be connected to the mixing chamber and the capillary plug. A water jacket can also enclose the gas being conveyed to the outlet port in order to minimize the deposition of solid products of chemical reaction(s) on the walls of the reactor. The heater element can be an electrical heater, and can be regulated by a thermocouple. The gas inlet ports into the mixing chamber can cause the gas to assume a vortex flow. The substrate can be held in place at the enlarged end of the diffuser chamber by one or more quartz pins. The reactor can have two mixing chambers, one mixing chamber mixing reactor gases and delivering them to a first capillary plug; and the second mixing chamber mixing separate reactor gases and delivering them to a second capillary plug, the separate reactive gases being mixed after passing through the first and second capillary plugs into an outwardly diverging conical diffuser chamber. The resistance heater also comprises a wound heating element formed of nichrome metal, the element can be enclosed in a heat reflecting mirror, and a ceramic heater housing which can be enclosed in a quartz tube. In the reactor, the mixing chamber can be located below the tube, which can be located below the capillary plug, which can be located below the expanding diffuser chamber, which can be located below the substrate at the top of the expanding diffuser chamber.

DRAWINGS

In drawings which illustrate specific embodiments of the invention but which should not be construed as limiting or restricting the scope of the invention in any way:

FIG. 6($b$) illustrates a top view of the geometry of the mixing chamber;

FIG. 8($b$) illustrates a graphical depiction of the thickness profile of a film deposited on a planar surface in the impinging jet geometry (as shown in FIG. 8($a$);

Figure 11:
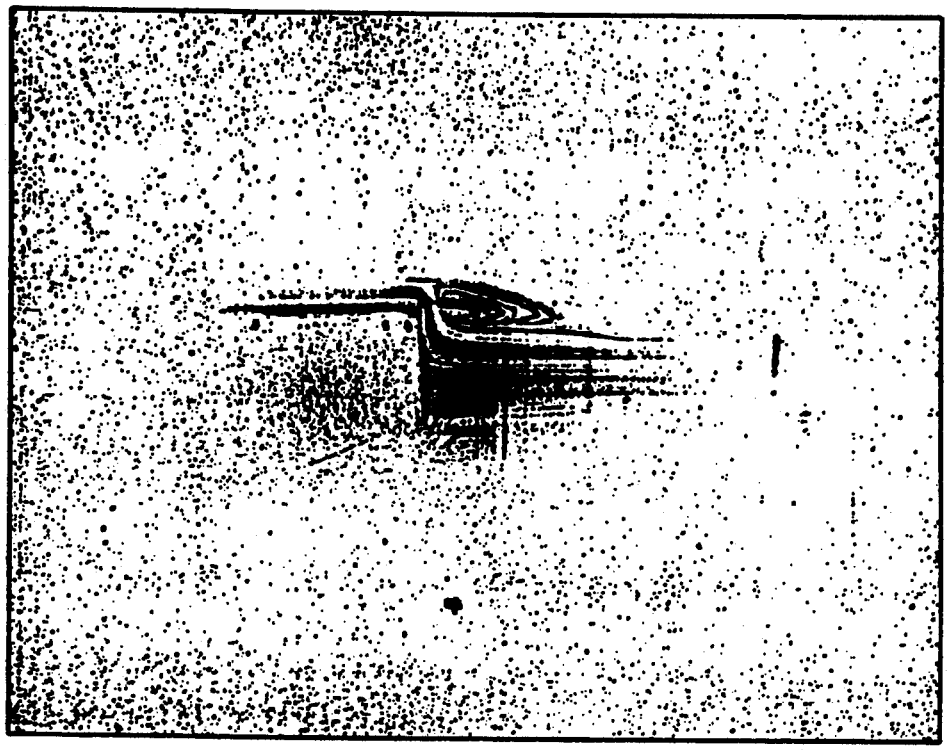
Figure 10:
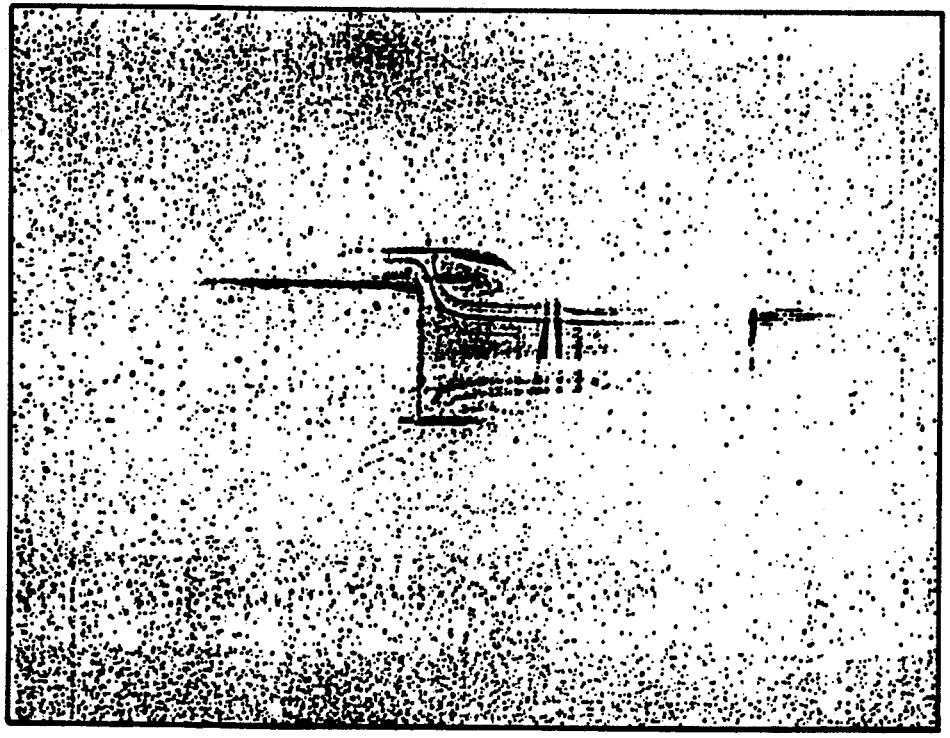
Figure 13:
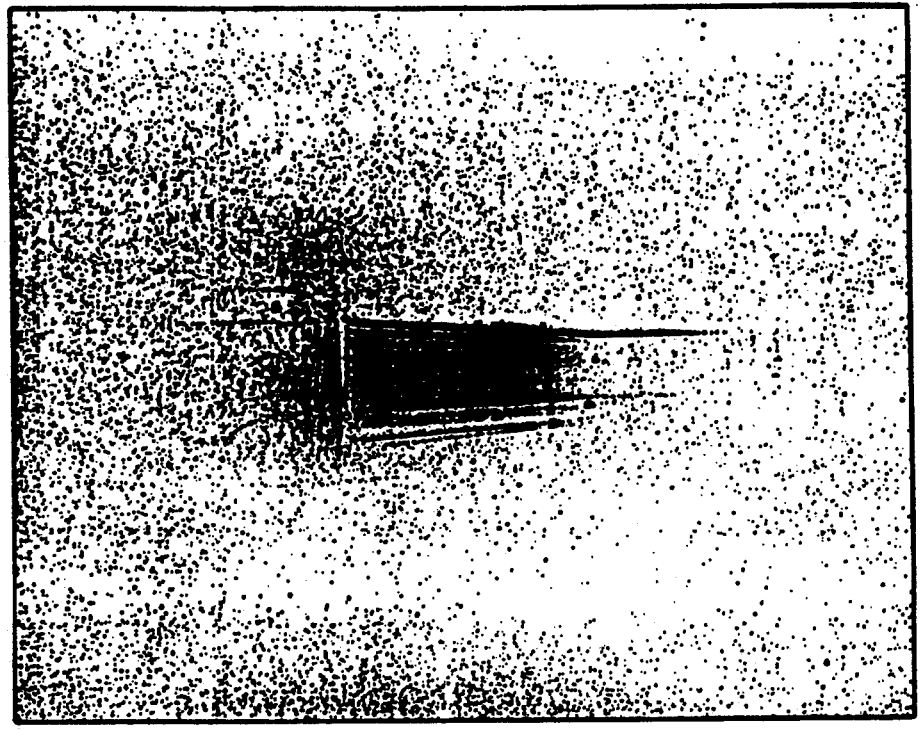
Figure 12:
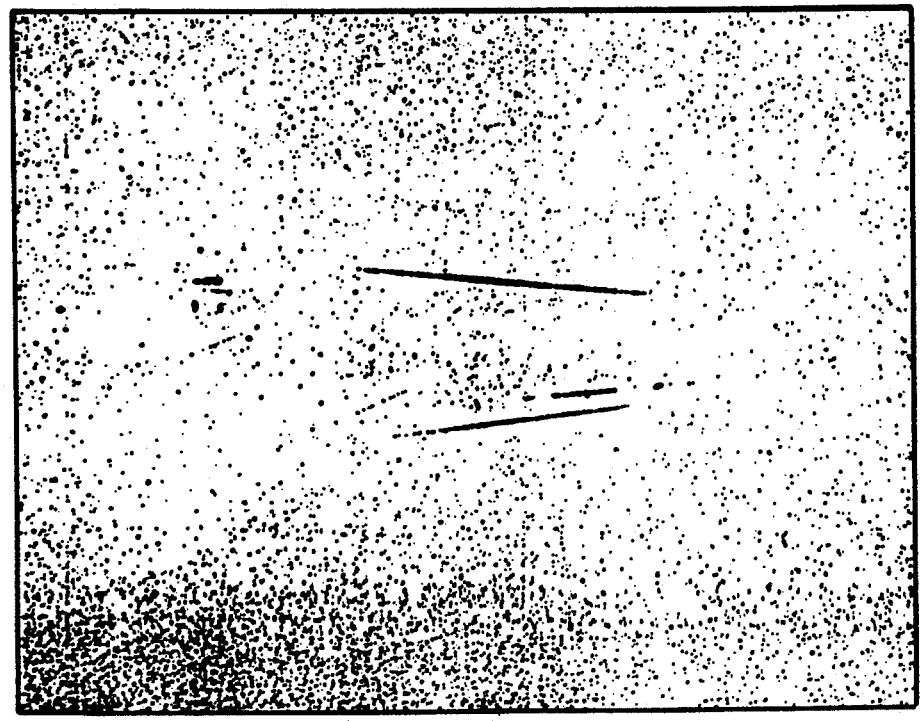
Figure 15:
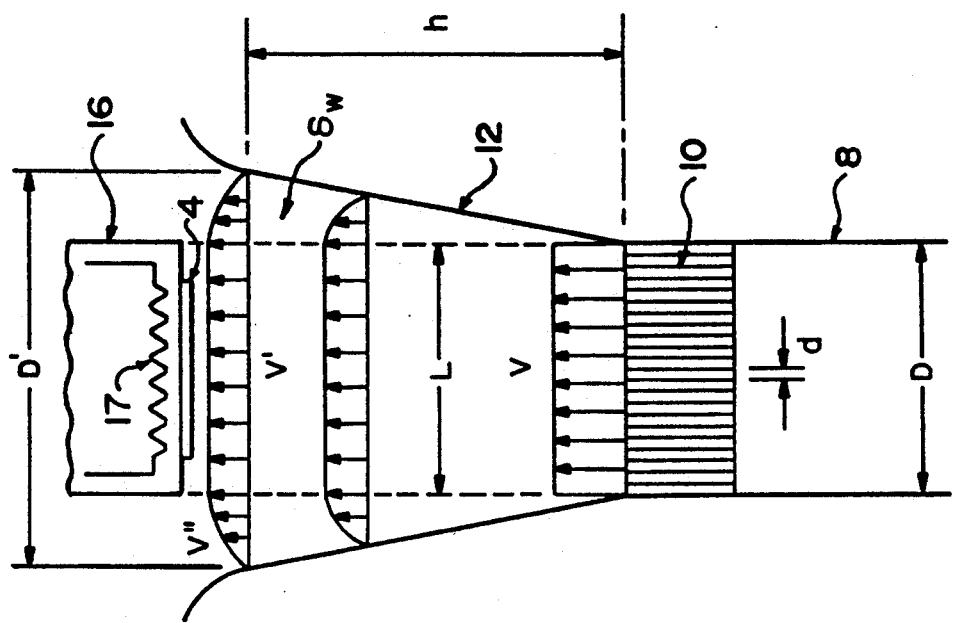
Figure 14:
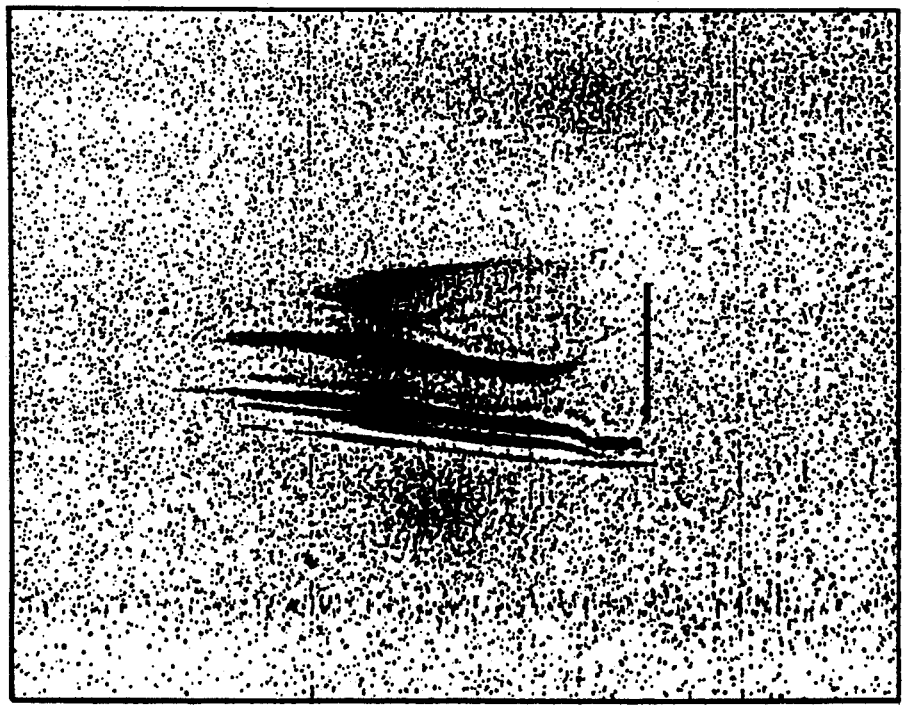
Figure 17:
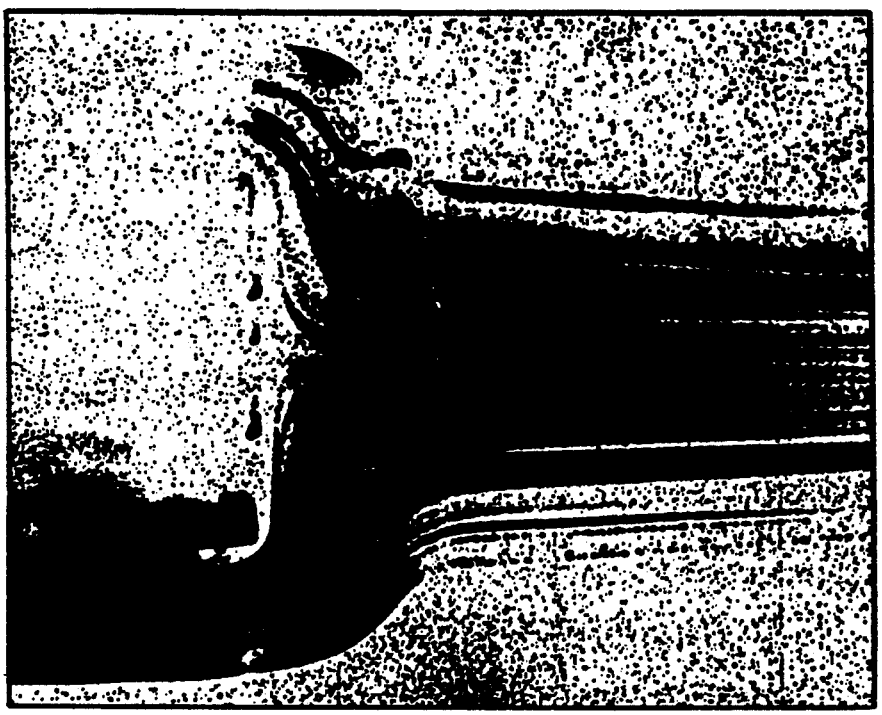
Figure 16:
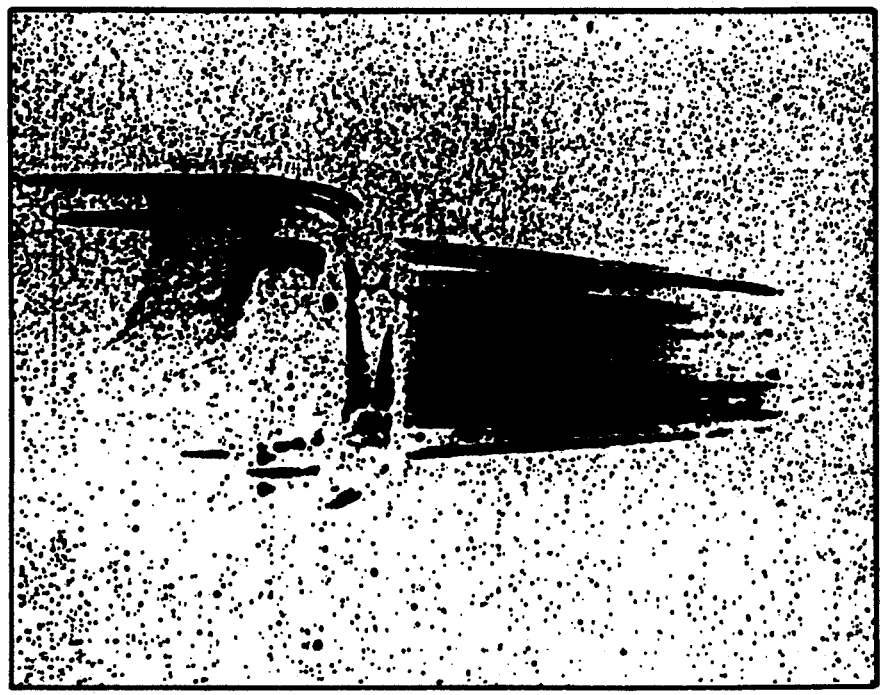
Figure 18:
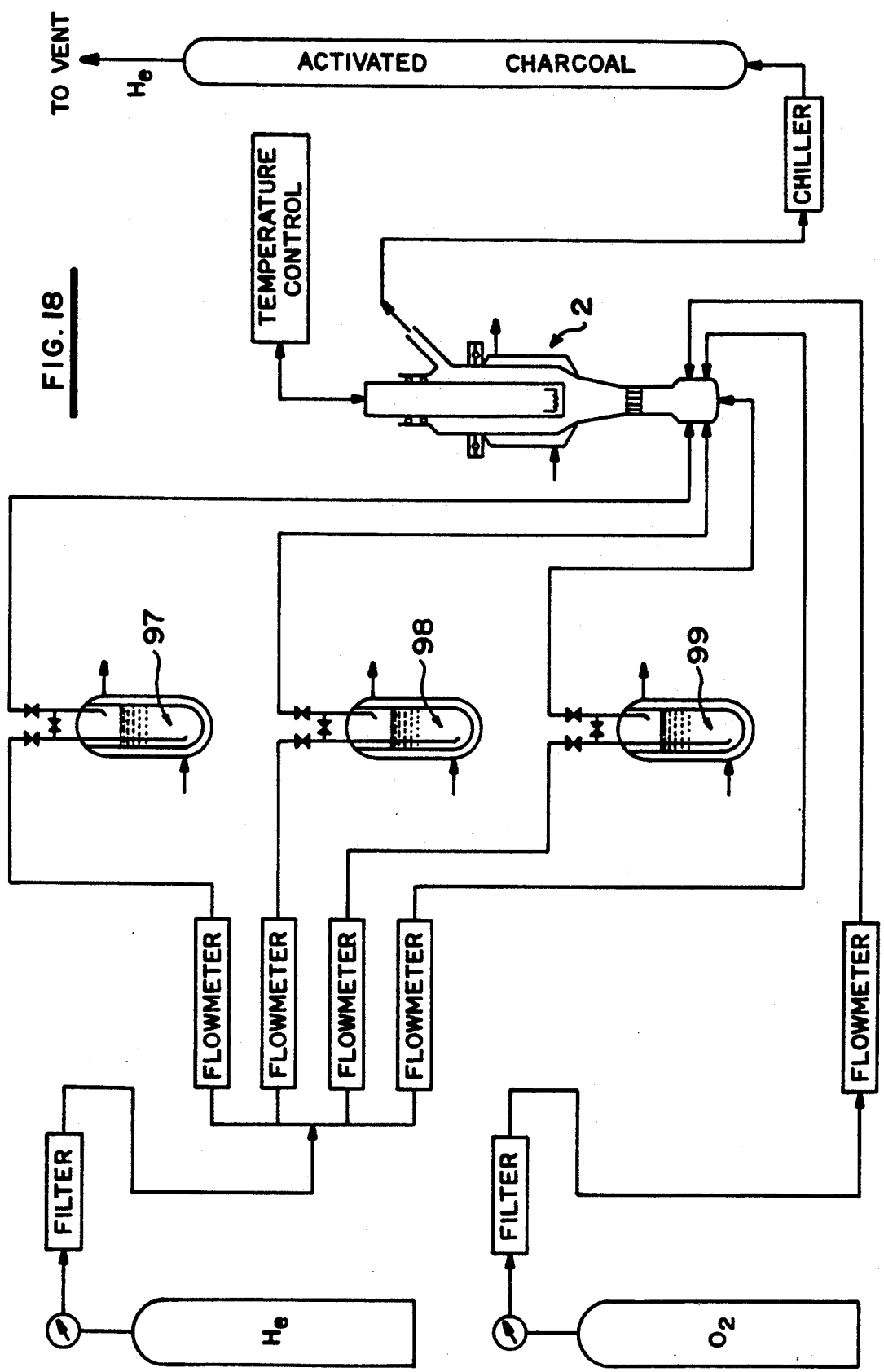

FIG. 9 illustrates in frontal view the shapes of various reactor tubes, namely:
A: a cylindrical reactor;
B: a triangular reactor;
C: a diffuser shape reactor; and
D: a modified and optimized diffuser reactor;

FIG. 10 illustrates a photographic depiction of the flow through a cylindrical reactor at room temperature;

FIG. 11 illustrates a photographic depiction of the flow through a triangular reactor at room temperature;

FIG. 12 illustrates a photographic depiction of the flow through a diffuser shape reactor at room temperature;

FIG. 13 illustrates a photographic depiction of the flow through a modified diffuser at room temperature;

FIG. 14 illustrates a photographic depiction of an asymmetric vortex in a diffuser shape reactor at 500° C., in which the gas flow is from the top of the diffuser;

FIG. 15 illustrates a schematic depiction of the thickness of the boundary layer on the walls of a modified diffuser;

FIG. 16 illustrates a photographic depiction of gas flow through a modified diffuser at heater temperature of 500° C.;

FIG. 17 illustrates an enlarged photographic depiction of gas flow through a modified diffuser at reactor temperature of 500° C.;

FIG. 18 illustrates a schematic flow chart of an MOCVD system for iron disulfide.

DETAILED DESCRIPTION OF SPECIFIC EMBODIMENTS

I have invented an improved chemical vapor deposition reactor (CVD) design for thin film deposition. It uses a plug of thin walled, closely placed capillaries, as a similar structure therein, to achieve uniformity in gas flow. A number of improvements over normal CVD Design allow the effective use of capillaries. These are first, angled gas input nozzles in a mixing chamber to force a vortex in the incoming gases, second an inverted design such that the gas flows upward to the substrate to be coated which is held face down and third a specially designed diffuser to assure streamlined flow.

The vortex induces rapid and thorough mixing of the gases. The gas flow through the plug of capillaries forces the mixed gas to flow evenly with no radial variation of velocity of the gas flow and no remaining vortex component. The inverted geometry of the reactor helps to minimize convection-related instabilities in the gas flow that are otherwise associated with the hot substrate. In a simple manner the novel reactor design permits well-controlled chemical vapor deposition (CVD). The diffuser design moves the gas from the plug to the substrate with no new vortices initiated.

The reactor avoids rotating parts or vacuum techniques which are normally used to obtain uniform films. These tech-niques are troublesome in a highly reactive gas environment. Variations in the approach include similar features in each of concentric nozzles where some gases must be kept apart until they reach the substrate.

The reactor of the invention has been designed for the purpose of depositing thin films of metals and/or semiconductors on the surface of a variety of substrates such as pyrex glass, sapphire, quartz, iron and titanium sheets. The substrates are attached by a pair of quartz pins to a resistively heated, quartz encapsulated graphite block.

The device primarily consists of a mixing chamber at the bottom and a nozzle comprising a plug of capillaries. The upward exit from the capillaries opens into a diffuser element which guides the gas over the substrate and then to a section cooled by an outer water jacket and finally to an gas exit port at the top.

Figure 1:
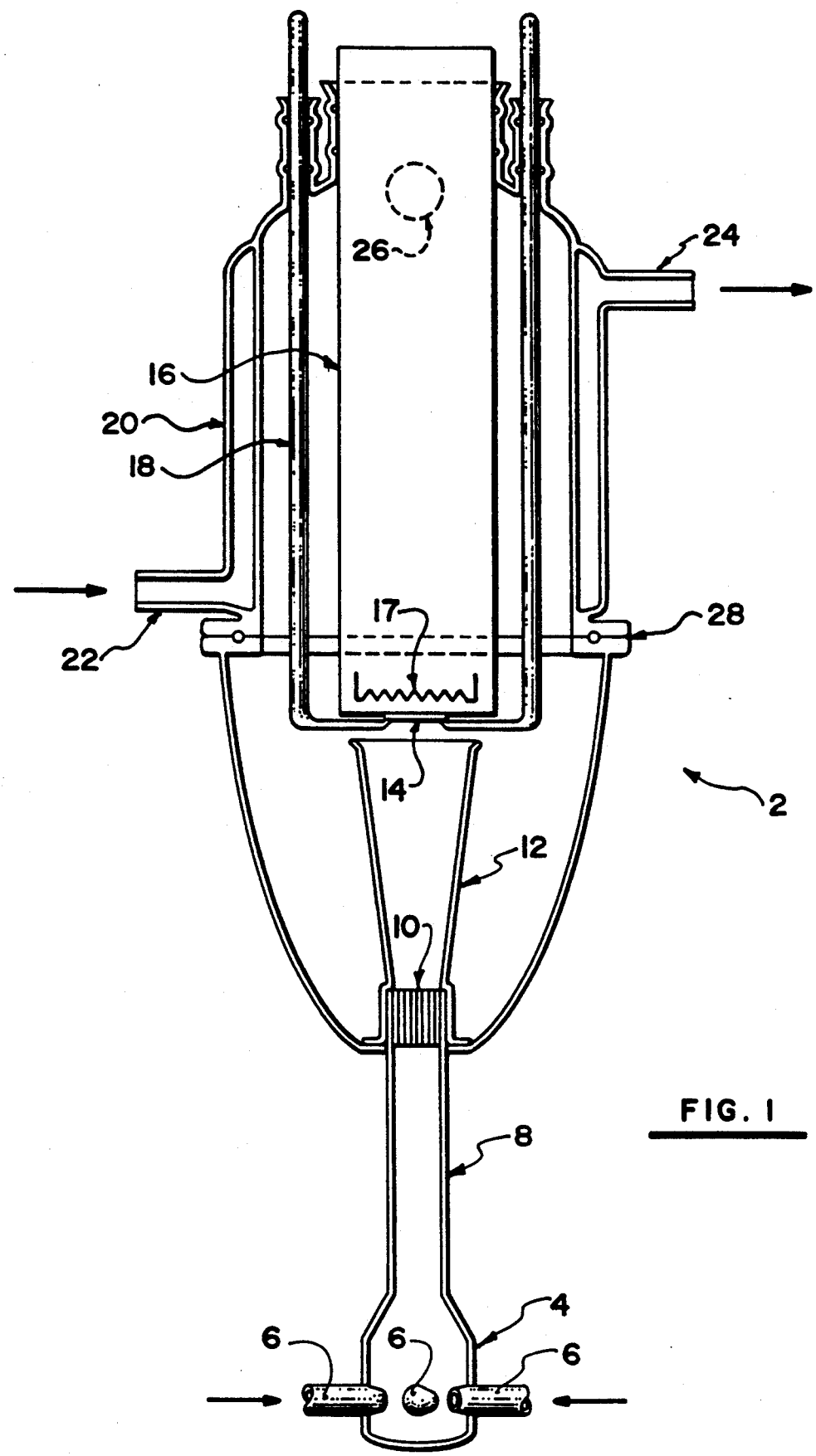
FIG. 1 illustrates a front view of one embodiment of the inverted reactor.

FIG. 1 shows the details of such a reactor system in a front section view. The reactor design shown in FIG. 1 consists of a mixing chamber 4 at the bottom of the reactor 2. The mixing chamber 4 consists of a glass chamber and several nozzles 6 for gas inlet in radial positions. The tangential nozzle geometry brings about rapid mixing of flows of different vapour constituents and a diluent gas by circumpherentially arranging the gas inlets to point in the same direction away from each other. This generates a vortex in the chamber 4 and ensures rapid and uniform mixing.

The gas mixture then proceeds upwardly through tube 8 and encounters a plug 10 made up of a bundle of fine capillaries (O.D.=1 mm, I.D.=0.7 mm) of equal length. The most important aspect of this capillary design feature is the resulting streamlined and uniform axial distribution of gas mixture and concurrent removal of the vortex created in the chamber 4 and tube 8. The upflowing gas that emerges from the capillary plug nozzle 10 enters a carefully optimized, gradually widening diffuser 12. The guidelines for the design and stability of the diffuser 12 are discussed later in this disclosure.

The gas that leaves the diffuser 12 impinges vertically upwardly onto a horizontal substrate 14 that faces downwards. The substrate 14 is attached to a resistively heated, quartz encapsulated graphite block heater 16 by means of a pair of quartz pins 18. The heating element 17 is proximate to the substrate 14. Such a gas flow pattern develops an axially uniform boundary layer across and adjacent to the surface of the heater 16 with a stagnation point at the centre of the flow. The development of an axially uniform boundary layer ensures that the chemical species in the gaseous mixture have uniform homogenous access to the surface. The lack of vortex component in the flow at this stage results in the deposition of thin films of uniform thickness and chemical composition. The reaction chamber is cooled with a water jacket 20, with water inlet 22 and water outlet 24. The gases exit through outlet 26. The reactor can be flange 28 disassembled by disconnecting it at O-ring flange 28.

The inverted geometry of the reactor 2 assists in minimizing the convection related instabilities in the gas flow. In the inverted geometry, convection and flow assist each other rather than countering each other as in conventional CVD geometry. This feature coupled with the vortex mixer 4, the capillary plug 10 and the customized diffuser 12 assist in maintaining an axially uniform vortex-free stable gas flow throughout the reactor 2. This eliminates the complexities of substrate rotation and/or the application of a vacuum to the system. The simplicity of the design and minimum required instrumentation offers the advantage of being able to scale up the system for large scale applications.

ALTERNATIVE EMBODIMENT

Figure 2:
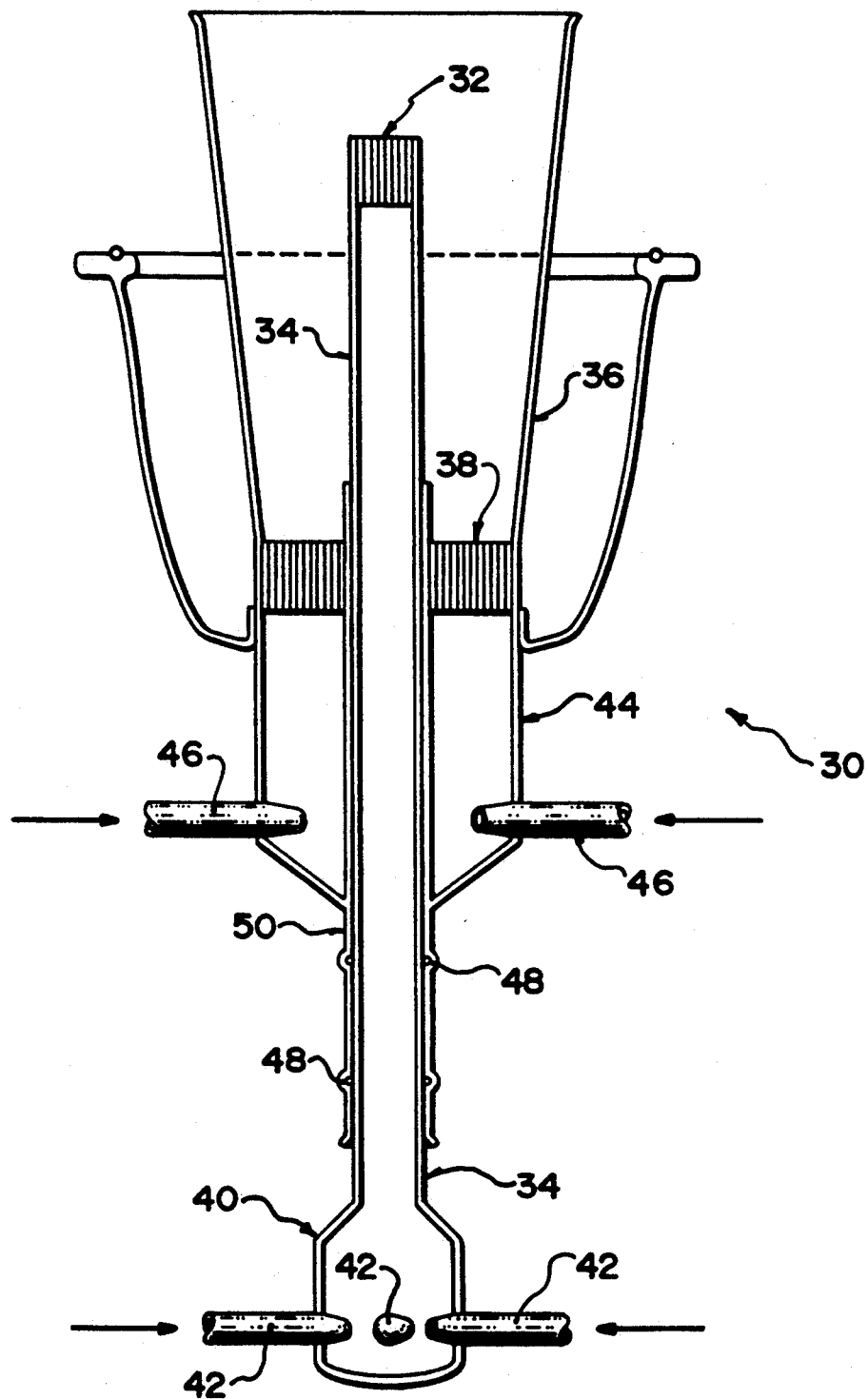
FIG. 2 illustrates a front view of an alternative embodiment of the reactor used for highly reactive reagents.

In chemical gas vapor deposition processes one encounters at times reactants which react instantly upon mixing. To deal with this potential problem, the reactants are mixed in the alternative reactor design illustrated in FIG. 2 just below the surface of the substrate by separately admitting them in the reactor by a composite nozzle. The composite nozzle 30 consists of capillaries 32 placed in a centre tube 34 which extends into the diffuser 36. The remaining area of the composite nozzle 30 at the base of the diffuser 36 has a second group of capillaries 38 to control the gas flow through this part of the nozzle. The centre tube 34 has a vortex mixing chamber 40 with tangential nozzles 42 at the bottom. Another mixing chamber 44 is located below the capillary group 38, with tangential nozzles 46. 0 rings 48 seal the space between the central tube 34 and an outer separator tube 50 and permit vertical adjustment of the central tube 32.

EXAMPLE 1

Figure 3:
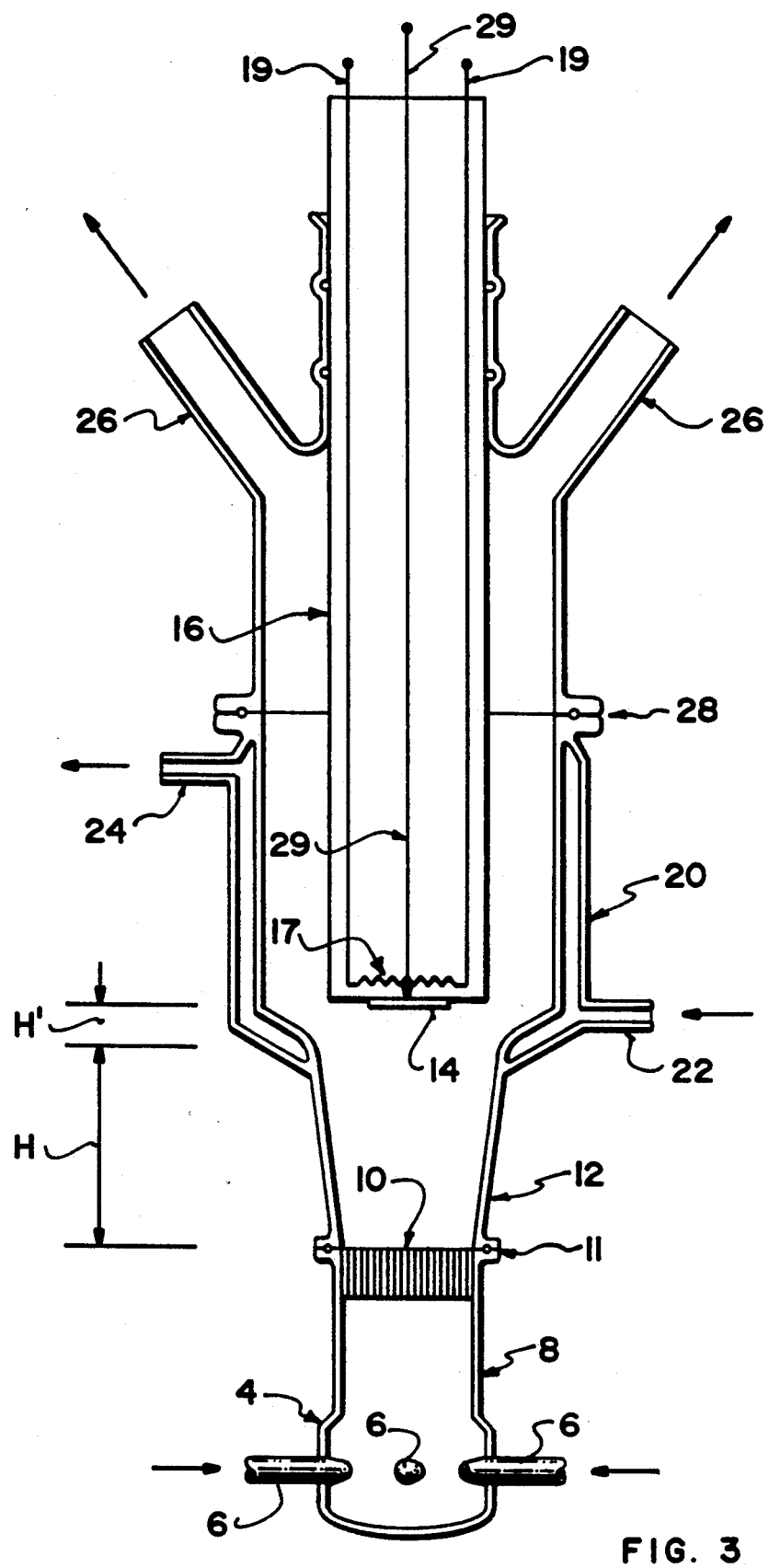
FIG. 3 illustrates a front view of an alternative embodiment of the reactor.

A reactor as shown in front view in FIG. 3 was designed and constructed at Simon Fraser University, Burnaby, British Columbia, for Metalorganic Chemical Vapor Deposition of thin films of $FeS_2$.

The reactor design illustrated in FIG. 3 is similar to the reactor design illustrated in FIG. 1. However, minor construction changes were made in constructing the reactor at Simon Fraser University. The gases are delivered into the mixing chamber 4 by means of vortex creating gas inlets 6. The tube 8 is wider and shorter than the tube 8 illustrated in FIG. 1. The capillary plug 10 is located at the top of tube 8. The tube 8 and mixing chamber 4 can be disconnected from the optimized diffuser 12, by O-ring seal 11. This readily permits capillary plugs to be interchanged or cleaned. The substrate 14 is mounted at the top centre of the optimized diffuser 12. As seen in FIG. 3, the water jacket 20, with water inlet 22 and water outlet 24 envelops only the lower heart portion of the resistance heater 16. The electrical element 17 is positioned immediately above the substrate 14. Electrical current required to heat element 17 is delivered by electrical leads 19. Immediately above the water jacket 20, an O-ring seal 28 is positioned to enable the reactor to be disconnected at that point. A thermo-couple 29 regulates the resistive element 17 and enables steady temperatures to be maintained. The flow gases exhaust through a pair of diagonal exhaust vent VLHS 26. The reactive gases are passed through an activated charcoal column to clean up the exhaust.

The reactor consists of several novel aspects which are listed below:

1) Capillary Plug

The plug has approximately 130-140 capillaries/$cmp^2$. Such a structure can be easily constructed of metal (e.g. stainless steel) for reactor safety by carefully drilling the holes of the dimensions of the capillary in a flat circular plate (disk). Alternatively, stainless steel tubes (very fine tubes of thin walls and equal length) can be welded or soldered together to construct such a structure. Thin walled, close spaced, uniform, parallel capillaries are bundled together to form a capillary plug. The inner diameter of each capillary is approximately 0.7 mm. The gaseous mixture from the mixing cup passes through such a plug where the angular component of velocity of gas molecules is removed. Also, the capillary plug due to equal interaction of gas molecules with each capillary produces a laminar and axially uniform velocity profile at the exit plane of the capillary plug. Thus, the capillary plug acts as an excellent gas distributor.

2) Conical Diffuser

It is optimized fluid dynamically in its length so that its width accommodates the boundary layer (in which the gas velocity profile is non-uniform) leaving the potential core (the region of uniform axial velocity) in the central region. In such a case, the length of the diffuser is much smaller compared to the hydrodynamic entrance length L. The hydrodynamic entrance length is defined as the length of the conduit between the point of entrance of fluid into the conduit and the point where the boundary layers from the opposite walls merge. Beyond this point, the velocity profile in the conduit is laminar and unaltered as defined by the well-known Hagen-Poiseuille equation.

3) Direct Entry

The gas flow leaving the capillary plug with axially uniform velocity profile enters directly into the diffuser.

4) Substrate

The substrate on which the film deposition occurs is attached to the heater by quartz/stainless pins. The plane of the substrate intercepts the uniformly distributed gas flow at right angles at the exit plane of the diffuser with the stagnation point being at the center of the substrate. The position of the substrate is so adjusted that the area covered by the axially uniform velocity profile is greater than the area of the substrate itself as shown in FIG. 15. This creates a uniform boundary layer adjacent to the substrate through which the chemical species diffuse to the surface of the heated substrate to react. The uniform-rate of diffusion of chemical species in the gas flow over the complete surface ensures a uniform deposition in thickness and composition.

5) Inverted Geometry

The geometry of the reactor is completely inverted so that the gaseous mixture enters the reactor at the bottom and flows upwardly and successively through the capillary plug and the diffuser and then over the heated substrate attached to the heater. It then leaves the reactor through two diametrically opposite exit ports at the top. In such an inverted geometry, thermal convection assists the upwardly gas flow in the reactor and stabilizes it with respect to vortex formation.

6) Elimination of Vacuum or Heater Rotation

The reactor system as designed, obviates the application of vacuum and/or heater rotation which is commonly employed to develop a uniform boundary layer adjacent to the surface of deposition. Such measures are found to be undesirable since a large quantity of highly poisonous and/or pyrophonic gases are routinely used in an MOCVD reactor in a glass enclosure. The presence of vacuum pumps or rotating heaters also increase the instrumentation and cost and complexity of the system.

7) Economy and Simplicity

An MOCVD reactor as developed (which employs no moving parts or pumps) exploits the nature and properties of gas flow and can be constructed from metal, e.g. stainless steel to enhance safety. Scale up of such a system for large area uniform deposition could be achieved without any apparent difficulty.

8) Simple Chemical Processes

The chemical processes that have been developed are simple and inexpensive. The chemical compounds involved: Iron Pentacarbonyl, $Fe(CO)_5$, Propylene sulfide, $C_3H_6S$ and t-Butyl Mercaptain, $t-C_4H_9SH$, are all inexpensive liquids. This avoids having to store and use a large quantity of highly toxic and/or inflammable gas of sulfur such as $H_2S$. At the same time, fire and explosion hazard are minimized. A safe and commercially viable process has thus been developed.

SYSTEM DESIGN AND ANALYSIS

The system design is subdivided into three sections as (a) Heater design (b) Optimization of reactor parameters and (c) Fluid Dynamical model of the reactor. The Heater is an integral 10 part of an metal organic chemical vapor deposition MOCVD reactor chamber, since its design, operation and control are crucial in determining the quality of the film deposited and in turn the electrical, optical or mechanical properties of the film. The MOCVD reactor is the chamber where the reactant vapors are 15 transported from outside in measured and predetermined quantities with a carrier gas and a chemical reaction is induced on the heated surface among the constituent vapors flowing over it. This results in a solid, uniform, thin and well adherent crystal-line film on the heated surface as one of the reaction products. The other reaction products, which are gaseous, leave the reactor through the exit port. These products are subsequently either scrubbed or absorbed on a catalytic charcoal and the remnant carrier gas such as $He/N_2/Ar$ or $H_2$ is vented to atmosphere. The complete system, including the source materials (which are liquids at room temperature), flow meters, carrier gas tubing, gas distribution manifold, the reactor and the exhaust gas scrubbing columns, etc. is placed inside a fumehood for safety.

HEATER DESIGN

An inexpensive, durable and reusable resistance heater has been designed and fabricated by the inventor at Simon Fraser University, (SFU) Burnaby, British Columbia, Canada. The most common mode of heating in MOCVD reactors is RF (Radio Frequency or Induction) heating. This mode of substrate heating is highly suitable for high temperature (~1200° C.) chemical vapor deposition CVD processes such as deposition of Silicon from $SiCl_4$ or $SiH_2Cl_2$. However, in medium-low temperature range, (~600° C. and below) the drawbacks of this substrate heating method become clear. The most prominent of them is poor low temperature control, since the minimum of the controlled temperature is dependent upon the radio-frequency used. This frequency is fixed at a certain value for a given RF generator.

The other disadvantages include, the expensive and complicated instrumentation, inability to work in a programmable mode and inductive coupling which limits the choice of material of construction of the MOCVD reactor to quartz. This implies operational hazard in the form of glass breakage and leakage of a large quantity of poisonous and/or pyrophonic gases. A plausible solution to this problem is to construct a stainless steel reactor. The substrate heating compatible for such a reactor is either optical (high power IR, tungsten-halogen lamps) or resistance heating. The prior one is expensive, difficult to control at low temperature levels (~200° C.) and may bring about undesired photochemical reactions. Also, the reactor design becomes complicated to accommodate the optics.

Resistance heating, on the other hand is inexpensive, safe, reproducible and simple to operate and control. Resistance heating becomes the most desirable for MOCVD if the issues of heater encapsulation and protection of throughputs in the reactive gaseous environment are well addressed. Several workers have reported employing resistance heating for MOCVD reactors, L. M. Fraas, P. S. McLeod, J. A. Cape and L. D. Partain, J. Crystal Growth, Vol. 68, pp 490 (1984) and S. I. Boldish, J. S. Ciaofolo and J. P. Wendt, J. Electronic Materials, Vol. 14, pp 587 (1985). Only Boldish, S. I. Boldish, Private Communications, has reported in detail, the design and operation of a resistance heater which employs a Pt-Rh heating element, a polished Pt heat reflecting mirror and a Boron Nitride (BN) heating block, encapsulated in a quartz tube. Such a heater needs a continuous purge of an inert gas during operation to protect BN block from oxidation. Also, the heating element is expensive.

Figure 4:
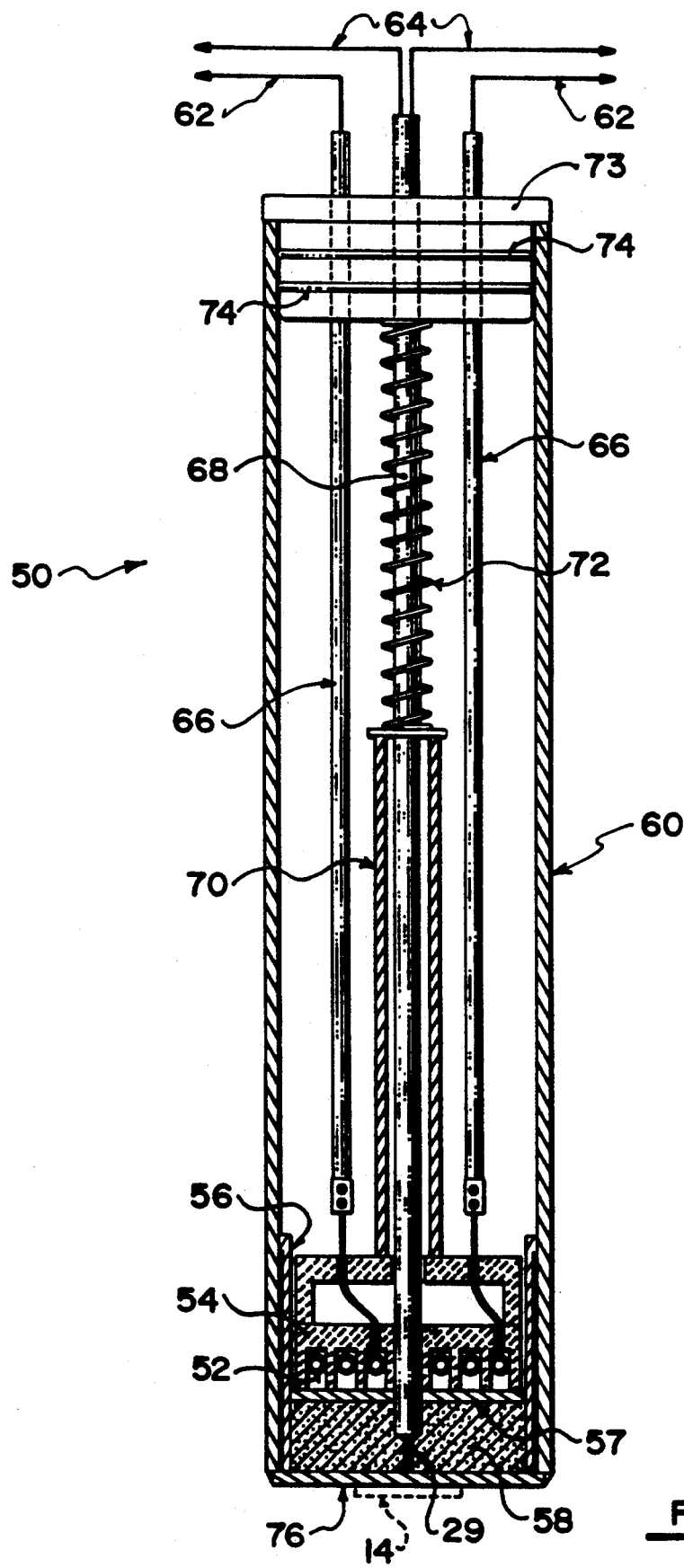
FIG. 4 illustrates a front view of the construction of the resistance heater for the MOCVD reactor.

A detail of the heater designed and built by the inventor at Simon Fraser University is shown in FIG. 4. FIG. 4 shows in front view the design of such a heater 50 which employs nichrome heating elements 52 placed in a ceramic housing 54, a GRAFPO; (grafic-foil) heating reflecting mirror 56 and a graphite heating block 58. The assembly is encapsulated in a quartz tube 60 with the power leads and axial thermocouple leads 64 emerging through the sealed end at the bottom. The power leads 62 are encased in ceramic tubes 66. The thermocouple leads 64 are encased in a double bore insulator 68. The insulator 68 is mounted inside a support quartz tube 70, held in place by a compression spring 72. Buna N O-rings 74 seal the bottom of the heater. The assembled heater 50 has a top quartz window 76.

The heater performance is evaluated by observing the melting behaviour of various high purity metal flakes such as In (m.p.=156.6° C.) Sn (m.p.=231.9° C.). Pb (m.p.=327.5° C.), Zn (m.p.=419° C.) and Al (m.p.=660° C.)). Under a constant flow of 5 l/min of He in an MOCVD reactor.

Figure 5:
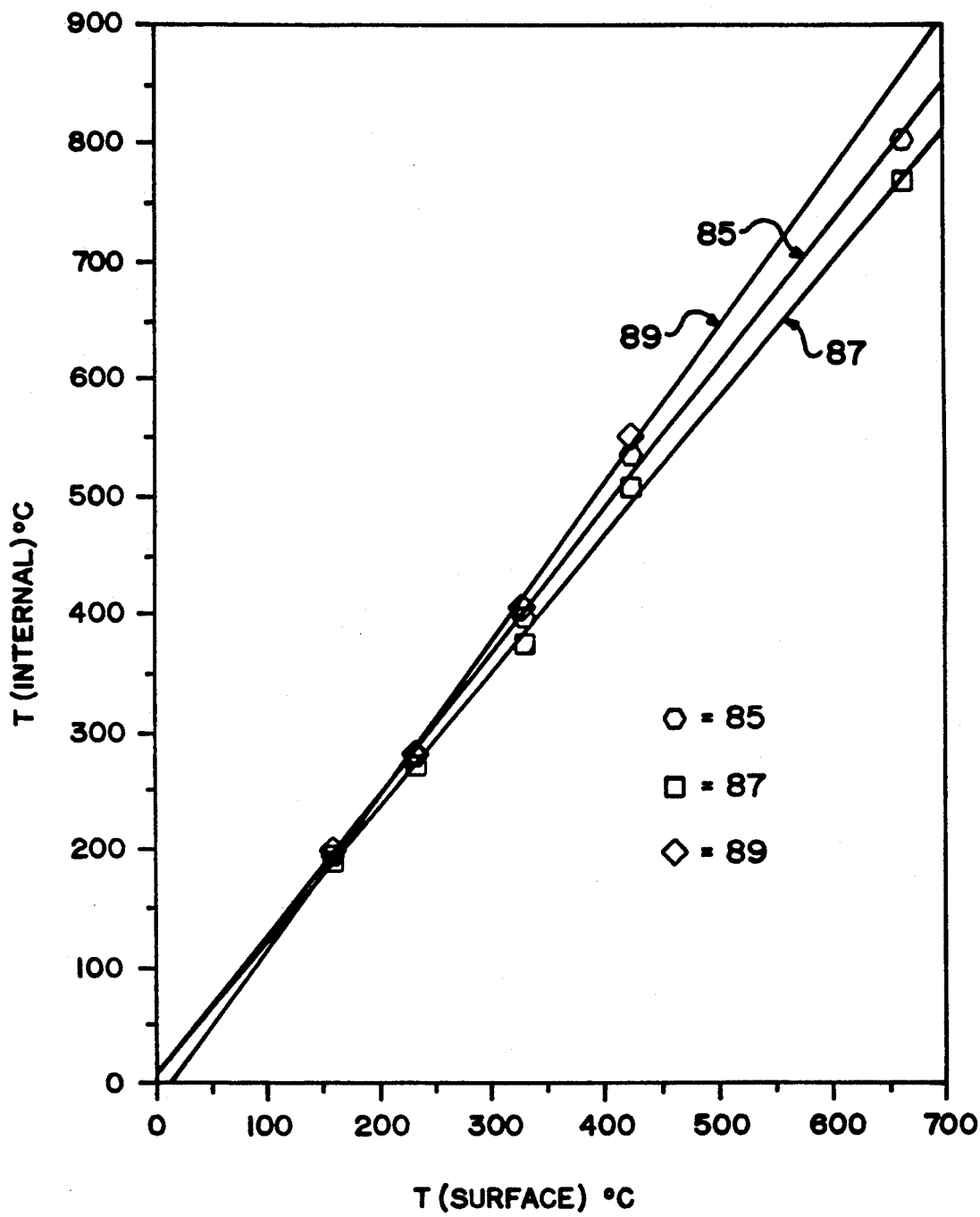
FIG. 5 illustrates a graph of internal temperature (degree Celsius) versus surface temperature (degree Celsius) for pyrex, glass and titanium substrates.

FIG. 5 shows the graphs of calibration of the resistance heater for different substrates such as Pyrex glass, Titanium and soda glass. The heater has been operational for the last 1½ years with little apparent change in the calibration. The performance of this heater is verified with the help of an infra-red pyrometer.

OPTIMIZATION OF REACTOR DESIGN

Figure 6A:
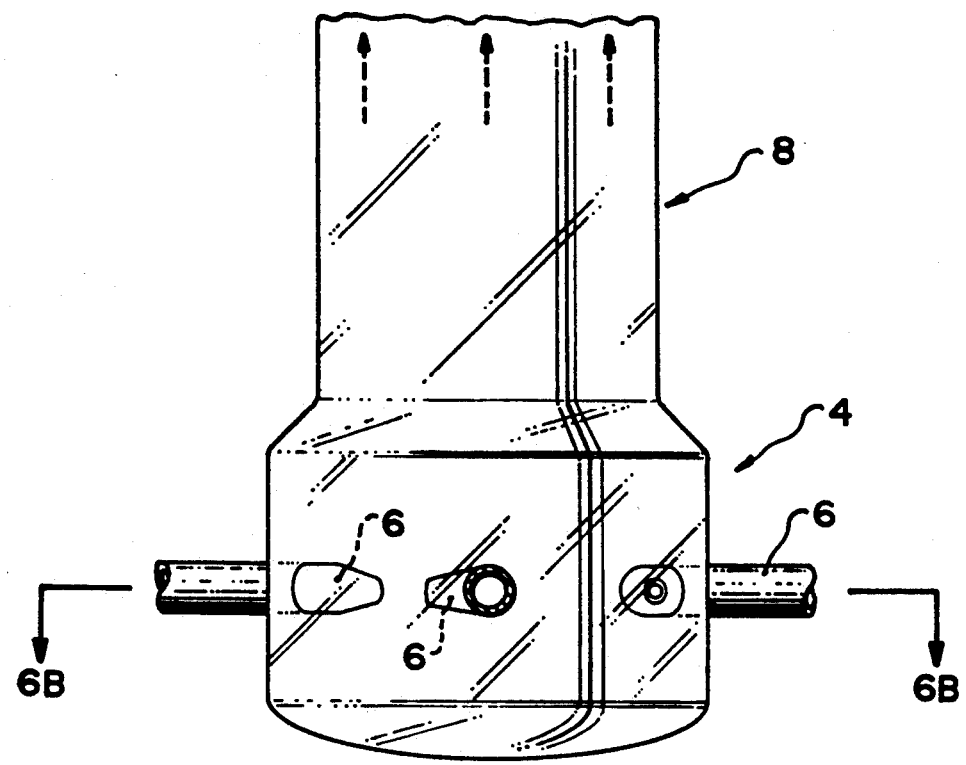
FIG. 6($a$) illustrates a front detailed view of the geometry of the mixing chamber of the reactor.

An MOCVD reactor consists of several parts such as mixing chamber, inlet, the bridging duct, reactor tube and the exhaust ports. For compositional uniformity, it is highly necessary to mix the constituent reactant vapors with the carrier gas thoroughly. The constituent reactant flow is typically of the order of 100 cc/min and that of the carrier gas is approximately 5 l/min for a reactor operating at atmospheric pressure. Rapid and uniform mixing of gases at such a varying rate poses a design problem. Head on impingement of jets in a closed cavity produces inadequate mixing, and back flow due to suppression of a weaker jet by a stronger one. To solve this problem in the applicant's mixing chamber, the jets are directed away from each other in the mixing chamber. Such a geometry is shown in FIG. 6a (side view) and FIG. 6b (top view). As a result the gas swirls into the chamber and thorough mixing is achieved without any backflow. Such geometry is highly useful in mixing of fluids at largely varying rates.

Figure 6B:
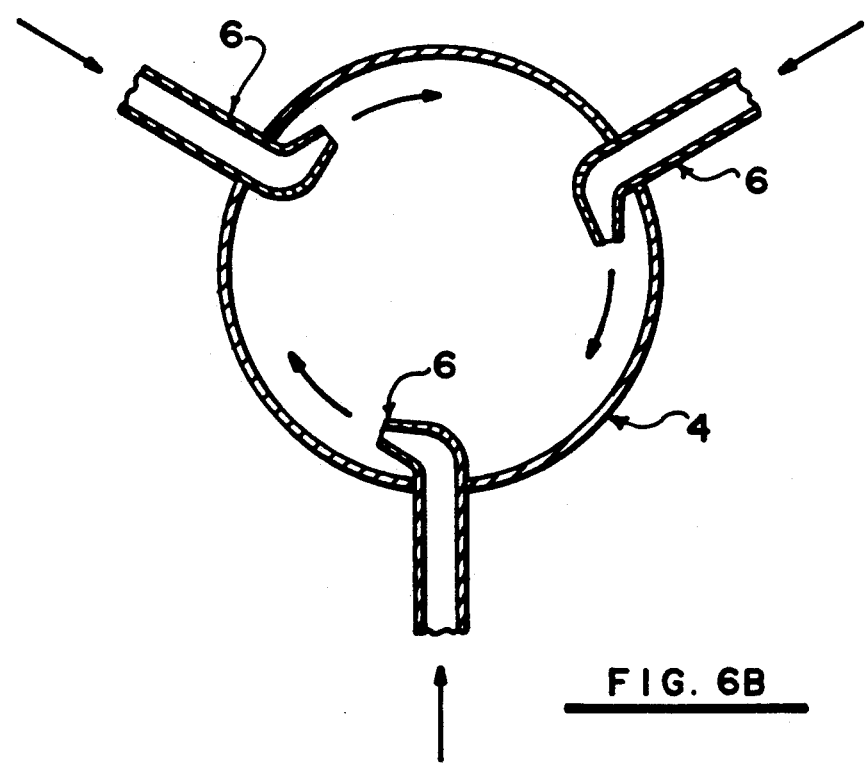

The gaseous mixture thus obtained further enters into the reactor through an inlet. The swirl imparts an angular velocity component onto the gas molecules which is highly undesirable for uniform deposition. FIG. 6(b) shows schematically angular velocity component superimposed on the gas flow in an MOCVD reactor tube.

INLET CONFIGURATIONS

Figure 7:
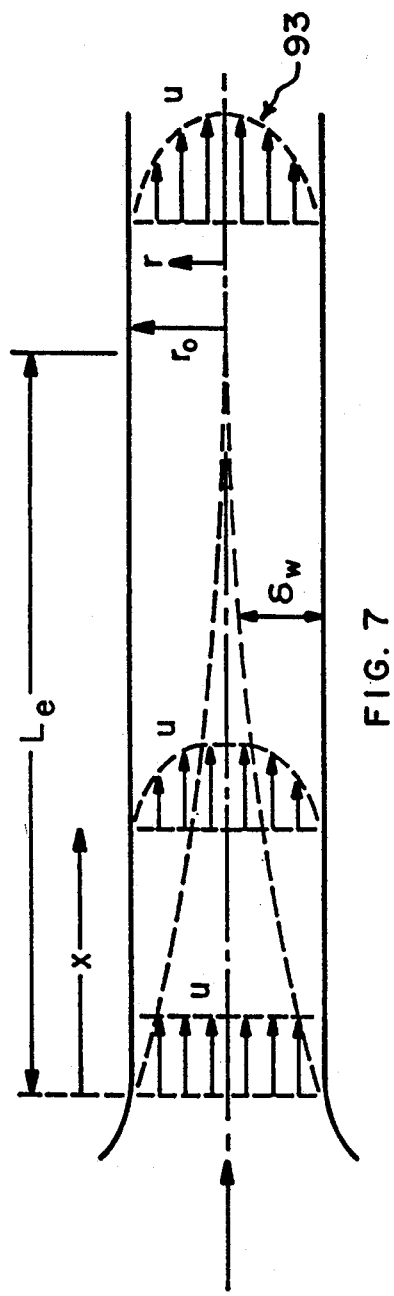
FIG. 7 illustrates a depiction of the development of the velocity profile in the hydrodynamic entry region of a pipe, as it applies to the reactor.

The fluid flow in a tube is markedly affected by the presence of the wall. More specifically the inner surface of the tube affects the flow velocity. It is a well known fact given in any standard textbook of Fluid Mechanics that adjacent to the wall, the fluid velocity with respect to the wall is zero. This results in a boundary layer or stagnant layer adjacent to the wall. The successive layers of fluid are then decelerated accordingly and a steady state pattern is achieved which is given by Hagen-Poiseuille velocity distribution functions, as shown in FIG. 7.

Figure 8B:
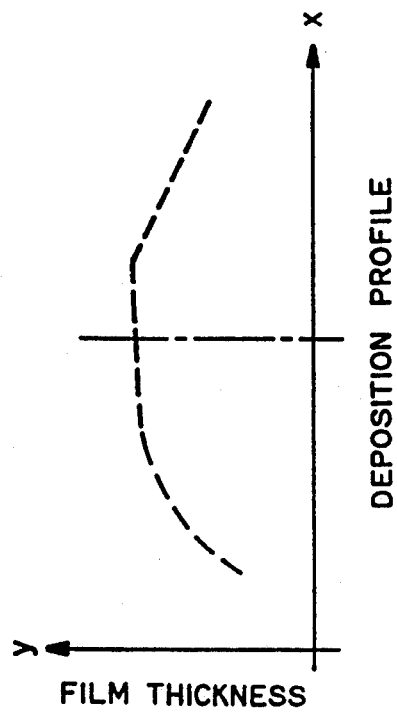
FIG. 8($a$) illustrates a front schematic depiction of the profile of an impinging jet against a fixed wall.
Figure 8A:
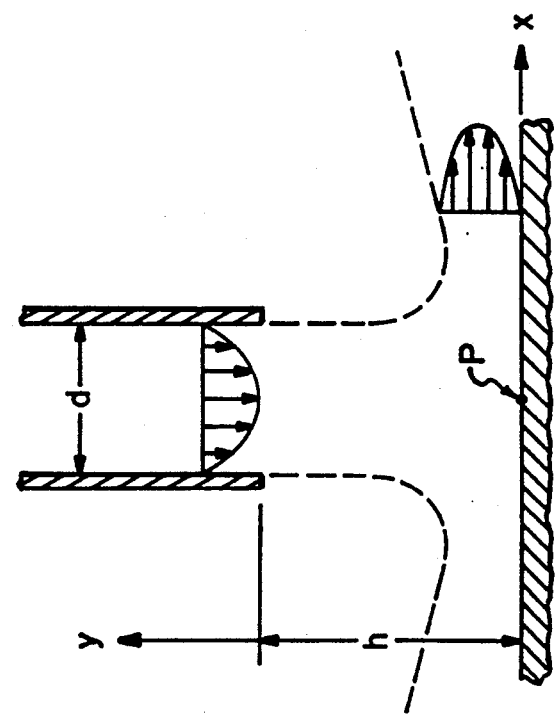

It is observed that such a non-uniform velocity distribution, although axially symmetric, does not lead to a large area of uniform deposition. Such a geometry is called an impinging jet and it is shown in FIG. 8(a). FIG. 8(b) illustrates a thickness profile for film deposition achieved with an impinging jet. An axially uniform flow is obtained by placing a porous plug in the inlet section of a tube. Such a porous plug acts as a flow distributor and converts the velocity profile from a parabolic one into an axially uniform one. At the same time the angular velocity component is also completely removed.

PLUG FLOW

Various materials can be used as the porous medium to distribute the gas such as, metal screens, brick, leather, cork, fibreglass, fused silica sand, etc. A porous medium is characterized by permeability k, which is given by Darcy's Law, R. D. Blevins, Applied Fluid Dynamics Handbook, Ch. 13, Van NOstrand Reinhold Company, New York, 1984, as $$V = \frac{Q}{A} = -\frac{k}{\mu} \frac{dP}{dx} \quad (1)$$

where,
V = flow velocity, (cm/s) k = permeability (cm$^2$)
Q = volume flow rate of gas (cm$^3$/s)
A = area of cross section of porous medium (cm$^2$)
$\mu$ = fluid viscosity (g/cm.s)
dP/dx = pressure drop across the porous medium (g/cm$^2$.s$^2$)

Where as porosity P of a porous medium is given by, $$P = \frac{\text{total Pore Volume}}{\text{total Volume}}$$

and it is expressed as percentage porosity of a porous medium. The typical value of permeability ranges from ~2×10$^{-10}$ cm$^2$ for brick, [18] 4×10$^{-7}$ for fiberglass and ~1.2×10$^{-9}$ for leather. Such a low permeability value must be coupled with a high value of pressure loss dP/dx, across the porous medium to achieve reasonable flow velocity.

Recently, Cox et al, H. M. Cox, J. Crystal Growth, vol. 59, pp 641 (1984), and J. S. Osinski, S. G. Hummel and H. M. Cox, J. Electronic Materials, vol. 16, pp 397 (1987) developed a novel method of Vapor Levitation Expitaxy (VLE) for deposition of thin films of GaAs in which the substrate levitates on gas just above the surface of a porous firt (made by fusing the silica sand) by using GaCl and AsH$_3$. The permeability of this material is approximately 4×10$^{-8}$ to 4×10$^{-9}$ cm.$^2$, R. D. Blevins, Applied Fluid Dynamics Handbook, Ch. 13, Van Nostrand Reinhold Company, New York 1984. The low permeability results into a low Reynolds' number (RE~1) and low velocity of gas issuing from the firt at atmospheric pressure. This design has two severe drawbacks, first it can operate only with high thermal stability compounds such as chlorides and hydrides i.e. GaCl$_3$ and AsH$_3$ as starting materials. The organometallics such as Ga (C$_2$H$_5$)$_3$ or Fe(Co)$_5$, which are marginally thermally stable would certainly decompose in the frit and clog it due to proximity of heated surface. This would effectively halt the system operation. The chloride process generally operates at higher temperature. This can enhance the possibility of cross diffusion through material interfaces and doping by chlorine itself which could be undesirable in some advanced electronic devices.

CAPILLARY PLUG FLOW

The flow through a porous medium is very difficult to analyze exactly due to the complex nature of pores and the exact correlation between the various parameters such as pore velocity (local velocity), filter velocity (overall velocity), permeability and porosity is rather complicated and based upon empirical parameters. The simplest model of a porous medium (an ideal porous medium) is the "Straight Capillaric Model", A. E. Scheidegger, "The Physics of Flow Through Porous Media", Ch. 6, University of Toronto Press, 1960. This represents a bundle of straight parallel capillaries of uniform diameter d. The flow through a capillary is given by well known Hagen-Poiseuille equation for a tube of uniform diameters d; as $$q = \frac{-\pi d^4}{128\mu} \frac{dP}{dx} \quad (3)$$

Comparing this equation with the Darcy's Law[eqn. (1)] i.e.

$$V = -\frac{k}{\mu} \frac{dP}{dx} \quad (4)$$

$$k = \frac{n\pi d^4}{128} \quad (5)$$

The dimensions of a typical capillary are, I.D.=0.07 cm. O.D.=0.09 cm and length L=1.0 cm. With this, n~140 and permeability k≈8.0×10$^{-5}$ cm$^2$ as calculated from eqn. (5). This value is approximately 2,000 times more permeable or about 3 orders of magnitude higher as compared to that of a porous frit. The most important implication of this fact is the ease (minimum pressure drop) with which one can achieve a reasonably high flow velocity (~20-30 cm/s). The uniformity of the structure ensures an axially uniform gas distribution without large pressure drop. The minimum length L of each capillary is determed considering the introductory length L$_e$, which is given by W. M. Kays and M. E. Crawford, "Convective Heat and Mass Transfer", Ch. 6, Second Ed., McGraw-Hill Blook Company, New York (1980)

$$L_e = 0.05 \cdot Re \cdot d \quad (6)$$

and $$L > L_3 \quad (7)$$

Where, $$Re\text{ - Reynolds' number} = \frac{V \cdot d}{\mu}$$

The physical structure, thus constructed by cementing thin walled capillaries of equal dimensions close to each other, or drilling fine holes in a stainless steel plate, or fusing or welding fine stainless steel tubes together, or some other suitable sytem, constitutes an ideal porous plug.

OPTIMIZATION OF REACTOR SHAPE the reactor shape is optimized by observing the gas flow through a variety of shapes. The path of the gas molecules is made visible by suspending fine $TiO_2$ particles generated in situ (in the mixing chamber) by the reaction between $TiCl_4$ and $H_2O$ in He as a carrier gas (which has similar fluid properties as that of $H_2$; $H_2$ is the most commonly employed carrier gas in MOCVD). Such a simulation technique though empirical, immediately makes visible the drawbacks in the design which would otherwise go unnoticed. Various reactor shapes and their dimensions are shown in FIG. 9. A cylindrical reactor is depicted as A, a triangular reactor is depicted as B, a diffuser shape reactor is depicted as C; and a modified and optimized diffuser reactor is depicted as D. The reactor is illuminated by a sheet of 5 mW He-Ne laser formed by placing a cylindrical lens in front of it. The scattered laser radiation from the $TiO_2$ smoke particles is recorded on a photographic plate. FIGS. 10 through 13 show photographs of gas flow through various reactor shapes from a capillary plug in the inlet, when the heater is off (T=298° K.). The vortices generated just above the heater surface, in cylindrical and triangular reactors due to sudden expansion of the tube diameter, are clearly shown in FIGS. 10 and 11. The diffuser (FIG. 12) and modified diffuser (FIG. 13) appear to be more appropriate shapes.

The flow through the diffuser at T=773° K. (FIG. 14) reveals a large asymmetric vortex as observed by Van Opdorp et al; M. De Keijser, C. Van OpDorp and C. Weber, J. Crystal Growth, vol. 92, pp 33 (1988) and P. J. Roksnoer, C. Van OpDrop. J. W. F. M. Macs, M. De Keijser and C. Weber, J. Electrochem. Soc., Vol 136, pp 2427 (1989), which makes such a reactor shape unsuitable for smooth, uniform gas flow and consequently uniform deposition onto the substrate attached to the surface of the heater. The fluid flow through the diffuser [defined as an expanding duct with an angle of containment $2\Theta \leq 12°$, (ch 7 of ref. 10),] is unsuitable for yet another reason, i.e. the large separation between the gas entry point and the heater (the height of the diffuser).

Figure 9A:
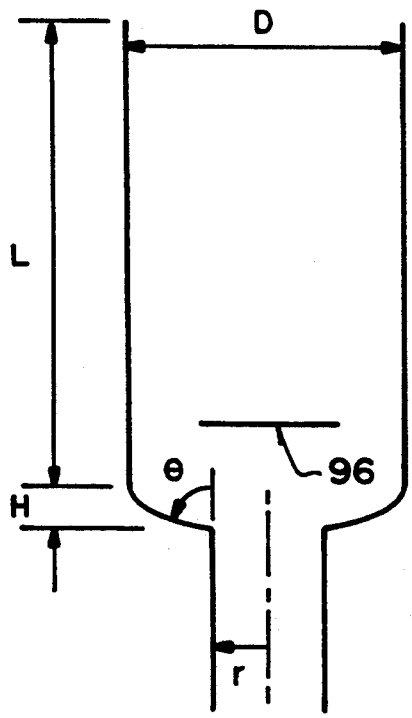
Figure 9B:
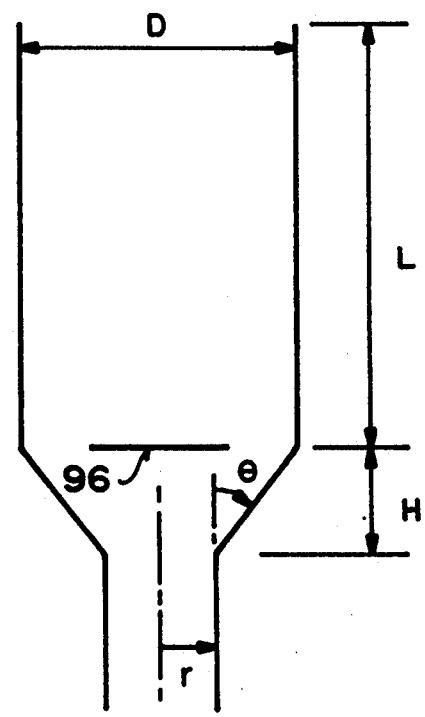
Figure 9C:
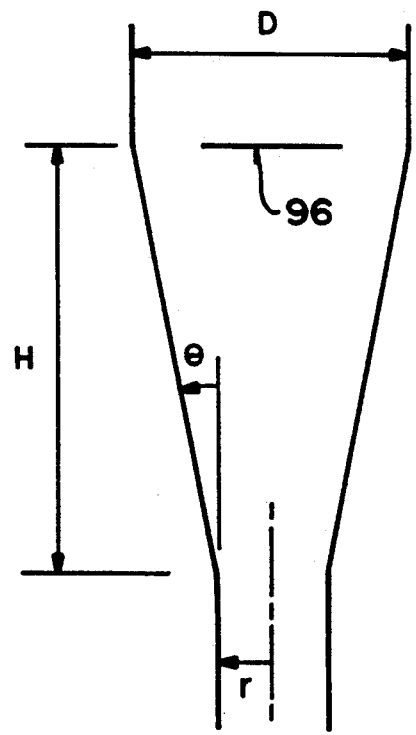
Figure 9D:
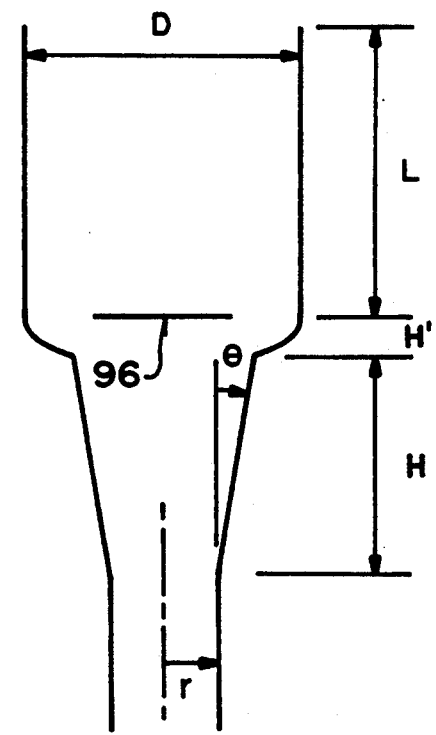

The geometry of the diffuser is shown in FIG. 15. The fluid dynamical analysis of a velocity profile and boundary layer thickness $\delta$, developed on the walls of the diffuser shows that the thickness of the boundary layer $\delta_W$ on the wall of an expanding duct is strongly dependent upon the axial distance x, local gas velocity $V_x$, and the radius R. This leads to a considerable shortening of the diffuser height and broadening of the inlet diameter in order to maintain the most important design parameter i.e. the angle of containment 20 within the limits i.e. $2\Theta \leq 12°$. This directly leads to the design parameters of a modified diffuser as shown in FIG. 9D.

The gas flow performance of such a reactor shape is verified at 773° K. and is shown in FIG. 16. A closer look at the gas flow through such a reactor shape in inverted position, in which the thermal convection assist the gas flow instead of opposing it, is shown in the enlarged photograph depicted in FIG. 17. Such a configuration is inherently stable and offers an important advantage of reduced particulate formation on the deposition surface and thus higher quality of the deposited film. The deposition occurs on the underside of an inverted surface (face down) attached to the heater either with the help of quartz/stainless steel pins or through a vacuum chuck (low vacuum holder).

With such optimization results, a schematic flow sheet of the final reactor design with a gas mixing chamber 2, capillary plug, modified (optimized) diffuser, and resistance heater and three separate liquid bubblers 97, 98 and 99 holding $Fe(CO)_5$, $t-C_4H_9SH$ and $C_3H_6$ S respectively in an inverted configuration, is shown in FIG. 18.

EXAMPLE 2

Thermochemistry of Formation of $FeS_2$

Several methods of preparation of $FeS_2$ are described in the literature, Mellor: "Theoretical and Inorganic Chemistry," Vol. 14, Cambridge Univ. Press, 1958. Most of the methods are related to bulk preparation of $FeS_2$, either directly from constituent elements (heating of Fe and S powder in a sealed ampule, in exactly stoichiometric amounts, over a period of several weeks) or heating together FeS (Iron Sulfide) and an excess amount of sulfur.

Recently, $FeS_2$ was prepared by heating $Fe_2O_3$ or $FeCl_2$ (anhydrons) with $H_2S$ between 300°–400° C. for 8-24 h., C. Iwakura, N. Isobe and H. Tamura, Electrochimica Acta, Vol. 28, pp 269, (1983). This method is verified in our laboratory, it is found unsatisfactory due to high reaction time necessary for conversion. Lower reaction time (typically ~1 h.) produced a mixed phase ($Fe_{23}+FeS_2$) whereas higher reaction temperature (~500° C.) produced $FeS_{2-x}$ which is a degenerate semiconductor (high electrical conductivity, metallic) unsuitable for photovoltaic application. This is obvious, due to high thermal stability of $H_2S$ over $FeS_2$ as shown by the following equations.

$$2H_2S \rightleftharpoons 2H_2 + S_2 \quad (8)$$

and,

$$FeS_2 \rightleftharpoons FeS_{2-x} + \frac{x}{2} S_2 \quad (9)$$

The thermodynamic calculations show that (Kirk and Othmer, Encyclopedia of Chemical Technology, pp. 375, Vol. 19, McGraw-Hill, 1976) $H_2S$ is highly stable in the temperature range of 300° C. to 400° C. (i.e. 573K to 673K). The equilibrium constants for $H_2S$ dissociation, equation (8), is given by:

$$K = \frac{p[H_2]^2 \cdot P[S_2]}{p[H_2S]^2} \quad (10)$$

Where, p is the partial pressure.

$$= 4.6 \times 10^{-9} \ 700K \ (ref. \ 20)$$

Thus, $$p[S_2] = k.p[H_2S]^2/p[H_2]^2 \quad (11)$$

Hence, in order to achieve high partial pressure of $S_2$ over $FeS_2$ to reverse the pyrite decomposition [eqn. (9),] it becomes necessary to raise the partial pressure of $H_2S$ in the gaseous mixture. $H_2S$ being an extremely poisonous gas, it becomes difficult and expensive to operate the system.

EXAMPLE 3

Alternate Sulfur Sources

A) t-$C_4H_9SH$

It is evident from the foregoing discussion that, the sulfur source must be thermally fissile in the temperature range of about 325° C. to 425° C. and yield sulfur readily. The chemical compounds that satisfy this criterion are, (a) tert-Butyl Mercaptan, t-$C_4H_9SH$ and (b) propylene Sulfide, $C_3H_6S$. Both of these chemical compounds are liquids, with low boiling points. This makes the transport of these chemicals in vapor form into the reactor extremely simple.

t-Butyl Mercaptan (2-methyl-2-propanethiol) has b.p.≈62°-65° C. and vapor pressure ≈100 torr at 20° C. The pyrolysis of t-Butyl Mercaptan yields t-butane $C_4H_{10}$ and butene $C_4H_8$ and sulfur as final products along with some $H_2S$; T. O. Bamkoke, J. Chem. Soc. Perkin Trans II, p. 439 (1977), in the temperature range of 696-672K. The value of dissociation constant k for the reaction $C_4H_9SH = C_4H_9. + .SH$ is approximately 0.25 at 700° K., T. O. Bamkoke, J. Chem. Soc. Perkin Trans II, p. 439 (1977). This high value of dissociation constant (compared to $4.6 \times 10^{-9}$ for $H_2S$) is mainly due to the weaker $C_4H_9$—SH bond and high stability of $C_4H_9$. (t-butyl) radical R. T. Morrison and R. N. Boyd, Organic Chemistry, Ch 4, 2nd Ed., Allyn and Bacon Inc., Boston (1968). It becomes thus a highly desirable substitution for sulfidation of $Fe_2O_3$ ($\alpha$ - Iron-Oxide) to form $FeS_2$ $Fe_2O_3$ in turn is prepared by oxidation of Fe $(CO)_5$ by $O_2$ at ~10% $O_2$+90G He) which is a known process. J. B. MacChesney, A. B. O'Connor and M. V. Sullivan, J. Electrochem. Soc., pp 776 (1971), given by the over all equation:

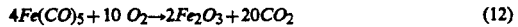

$$4Fe(CO)_5 + 10 \ O_2 \rightarrow 2Fe_2O_3 + 20CO_2 \quad (12)$$

The sulfidation of $Fe_2O_3$ by t-$C_4H_9SH$ can be thought to proceed through a reaction path in which .SH radical or HS-HS 9 i.e. $H_2S_2$) is the sulfidizing agent.

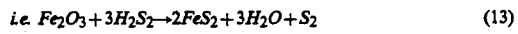

$$i.e. \ Fe_2O_3 + 3H_2S_2 \rightarrow 2FeS_2 + 3H_2O + S_2 \quad (13)$$

This reaction is carried out at 400° C. for 30 min. in a constant flow of Helium at a rate of 4.5 l/min. through an MOCVD reactor. The amount of t-$C_4H_9SH$ introduced into the reactor is approximately 600 $\mu$, mol/min. At the end of sulfidation, heating is switched off and t-$C_4H_9SH$ flow is switched off at ~250° C. The sample is further cooled to room temperature is He flow.

EXAMPLE 4

B) $C_3H_6S$:

The most desirable sulfur source for the vapor phase synthesis (deposition) of $FeS_2$ would be one that directly yields $S_2$ upon thermal decomposition. Such a sulfur source coupled with a volatile iron source such as $Fe(CO)_5$ will be the most appropriate combination of source materials. A class of sulfur compounds called episulfides which have a 3 membered ring, thermally decompose to give $S_2$ and alkene molecule ($C_nH_{2n}$, n=2,3, . . .). S. W. Benson, Chemical Reviews, vol. 78, pp 23 (1978). The first member of this family, ethylene sulfide, $C_2H_4S$ is a liquid that is susceptible to polymerization and is thus not suitable for long term storage. The next member of the episulfide family, Propylene Sulfide is a stable liquid (b.p.=72° C., vapor pressure ~90 mm of Hg at 10° C.) is available at a very reasonable cost from Aldrich Chemical Company, Wisconsin, U.S.A. It is thus the most appropriate choice as "the sulfur source" for MOCVD of $FeS_2$.

The thermodynamical calculations and the experiments show the formation of $FeS_2$ according to the following chemical scheme.

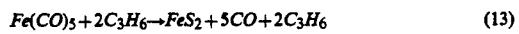

$$Fe(CO)_5 + 2C_3H_6 \rightarrow FeS_2 + 5CO + 2C_3H_6 \quad (13)$$

The above mentioned reaction is carried out in He as a carrier gas at 400°-425° C. on Titanium substrates.

EXAMPLE 5

In another series of experiments, Iron pentacarbonyl $Fe(CO)_5$ to $C_3H_6S$ molar ratio is held constant at 1:10, and $Fe(CO)_5$ flow rate into the reactor is 50 $\mu$mol/min.

EXAMPLE 6

Sulfurization of $Fe_2O_3$ by $C_3H_6S$ in He $Fe_2O_3$, which is deposited by the oxidation reaction of $Fe(CO)_5$ is sulfurized to form $FeS_2$ as a final product. Wöhler, Mellor: "Theoretical and Inorganic Chemistry," Vol. 14, Cambridge Univ. Press, 1958, prepared highly crystalline $FeS_2$ by heating an intimate mixture of $Fe_2O_3$ and S and $NH_4Cl$ at about 350° C. Also Titarenko synthesized spectrally pure Iron Pyrite by heating an intimate mixture of $Fe_2O_3$ an S in a sealed ampule, and analyzed it by X-ray diffraction.

$Fe_2O_3$ prepared by the oxidation of $Fe(CO)_5$ converts to $FeS_2$ after heating in $C_3H_6S$ at 400° C. for 30 min. in He as a carrier gas. The chemical scheme for the conversion of $Fe_2O_3$ into $FeS_2$ is given by:

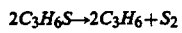

$$2C_3H_6S \rightarrow 2C_3H_6 + S_2$$

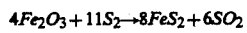

$$4Fe_2O_3 + 11S_2 \rightarrow 8FeS_2 + 6SO_2$$

The thermodynamic calculations show that in the reaction between $Fe_2O_3$ and $S_2$, Iron Pyrite $FeS_2$ is stable up to 450° C. Further heating leads to thermal decomposition of $FeS_2$ into $FeS_{2-x}$ which is a metallic conductor. In summary, it can be said that the most important factor for Propylene Sulfide ($C_3H_6S$) is its ability to pyrolyze at a temperature as low as 250° C. to yield $S_2$ and $C_3H_6$ (Propylene), due to its structure.

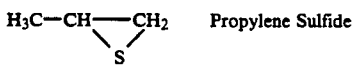 Propylene Sulfide

There is a considerable strain in the three membered ring due to a large size atom such as Sulfur which is responsible for its pyrolysis at a low temperature.

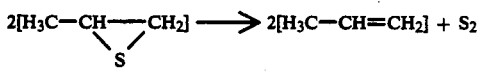

Films of $FeS_2$ deposited by this invention are of uniform thickness to within 3 percent over the substrate area of 15 mm × 15 mm.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

REFERENCES

1. J. A. Long, V. G. Riggs and W. D. Johnston, Jr., J. Crystal Growth, Vol. 69, pp 10 (1984).
2. G. Landgren, S. G. Andersson, J. Y. Andersson, L. Samuelson, P. Silverberg and P. Tolkein, J. Crystal Growth, vol. 77, pp 67 (1986).
3. EMCORE CORPORATION, Somerset, N.J., U.S.A.
4. L. M. Dea, P. A. McLeod, J. A. Cape and L. D. Partain, J. Crystal Growth, vol. 68, pp 490 (1984).
5. S. I. Boldish, J. S. Ciafolo and J. P. Wendt, J. Electronic Materials, vol. 14, pp 587 (1985).
6. S. I. Boldish, Private Communications.
7. C. A. Wang, S. H. Groves, S. C. Palinaten, D. W. Weyburne and R. A. Brown, J. Crystal Growth, vol. 77, pp 136 (1986).
8. C. Blauuw and C. J. Miner, J. Crystal Growth, vol. 84, pp 191 (1987).
9. D. J. Tritton, Physical Fluid Dynamics, 2nd Edition, Oxford Science Publications, Clarendon Press, Oxford, U.K. (1988).
10. R. D. Blevins, Applied Fluid Dynamics Handbook, Ch. 13, Van NOstrand Reinhold Company, New York 1984.
11. H. M. Cox, J. Crystal Growth, vol. 69, pp 641 (1984).
12. J. S. Osinski, S. G. Hummel and H. M. Cox, J. Electronic Materials, vol. 16, pp 397 (1987).
13. A. E. Scheidegger, "The Physics of Flow Through Porous Media", Ch. 6, University of Toronto Press, 1960.
14. W. M. Kays and M. E. Crawford, "Convective Heat and Mass Transfer", Ch. 6, Second Ed., McGraw-Hill Blook Company, New York (1980).
15. M. De Keijser, C. Van OpDorp and C. Weber, J. Crystal Growth, vol. 92, pp 33 (1988).
16. P. J. Roksnoer, C. Van Opdorp, J. W. F. M. Macs, M. De Keijser and C. Weber, J. Electrochem, Soc., vol 136, pp 2427 (1989).
17. Prasad N. Gadgil, to be published.
18. Mellor: "Theoretical and Inorganic Chemistry," vol. 14, Cambridge Univ. Press, 1958.
19. C. Iwakura, N. isobe and H. Tamura, Electrochimica Acta, vol. 28, pp 269, (1983).
20. Kirk and Othmer, Encyclopedia of Chemical Technology, pp 376, vol 19, McGraw-Hill, 1976.
21. T. O. Bamkole, J. Chem. Soc. Perkin Trans II, pp 439 (1977).
22. F. A. Cotton and G. Wilkinson, Basic Inorganic Chemistry, pp 10, Wiley, New York, 1976.
23. R. T. Morrison and R. N. Boyd, Organic Chemistry, Ch. 4, 2nd Ed., Allyn and Bacon Inc., Boston (1968).
24. M. V. Sullivan, J. Electrochem. Soc., vol. 120, pp 545 (1973).
25. J. B. MacChesney, A. B. O'Connor and M. V. Sullivan, J. Electrochem, Soc., pp 776 (1971).
26. E. M. Lown, H. S. Sandhu, H. E. Gunning and O. P. Strausz, J. American Chem. Soc., vol. 90, pp 7164 (1968).
27. S. W. Benson, Chemical Reviews, vol. 78, pp 23 (1978).

I claim:

1. A metal organic chemical vapor deposition reactor comprising a gas mixing chamber with gas entry ports into the mixing chamber; a substrate for deposition thereon of a thin solid film; and a gas outlet for conveying gas away from the substrate, characterized by a gas mixing chamber wherein gas is introduced into the chamber through at least two inlet ports in a tangential manner so as to impart a vortex mixing action to the gas, a capillary plug positioned above the mixing chamber and below the substrate, the capillary plug having therein a plurality of vertically extending and parallel capillary tubes which serve to streamline and evenly distribute the upward flow of gas to the substrate, an upwardly expanding vertically aligned conical diffuser chamber having a lower narrow end and an upper broad end positioned above the top of the capillary plug, the upwardly expanding conical diffuser chamber being designed to streamline the flow of gas from the capillary plug to the substrate, the substrate being positioned above the capillary plug and within the broad end of the upwardly expanding conical diffuser chamber.

2. A reactor as claimed in claim 1 wherein the substrate is heated.

3. A reactor as claimed in claim 1 wherein the substrate is heated by an electrical heater.

4. A metal organic chemical vapor deposition reactor operated at atmospheric pressures comprising:
(a) a gas mixing chamber with at least two gas ports directing gas tengentially into the interior of the mixing chamber to thereby impart a vortex flow to the gas;
(b) a capillary plug having an upper side and a lower side positioned above the gas mixing chamber and connected therewith by its lower side, said capillary plug having extending therethrough a plurality of vertically extending and parallel capillary tubes which are adapted to pass gas from the mixing chamber therethrough and to provide streamlined flow to the gas as it is vertically passed through the capillary plug and above the capillary plug;
(c) an upwardly expanding conical diffuser chamber having a lower narrow end adjacent the upper side of the capillary plug and an upper broad end opposite and above the narrow end, said narrow end being connected to an upper peripheral side of the capillary plug vertically opposite to the mixing chamber, said diffuser having a length, width and rate of divergence which maintains a uniform gas velocity profile to the gas exiting the upper side of the capillary plug and travelling upwardly through the interior of the upwardly diverging conical diffuser;

(d) a substrate located at the upper broad end of the upwardly expanding conical diffusing chamber, opposite to the capillary plug, and within the uniform gas velocity profile so that the upwardly flowing gas impinges uniformly at right angles on the substrate, said substrate having a dimension which is smaller than the dimension of the uniform gas velocity profile at the location of the substrate;

(e) a heater located proximate to the substrate for heating the substrate to an elevated temperature and;

(f) at least one gas outlet port adapted to convey gas away from the substrate and the heater.

5. A reactor as claimed in claim 4 wherein the heater is an optical high power IR or tungsten-halogen lamp heater.

6. A reactor as claimed in claim 4 wherein the capillary plug has therethrough approximately 130 to 140 capillary tubes per square centimeter.

7. A reactor as claimed in claim 4 wherein a hollow tube is positioned between and connects the mixing chamber and the capillary plug.

8. A reactor as claimed in claim 4 wherein a water jacket encloses the gas being conveyed to the outlet port in order to minimize deposition of solid reaction products on walls of the reactor.

9. A reactor as claimed in claim 4 wherein the reactor has two mixing chambers, one mixing chamber mixing reactor gases and delivering them to a first capillary plug; and the second mixing chamber mixing separate reactor gases and delivering them to a second capillary plug, the separate reactor gases being mixed after passing through the first and second capillary plugs into an diverging conical diffuser chamber.

10. A reactor as claimed in claim 6 wherein the capillary plug is a plurality of fine glass tubes arranged in parallel in a bundle.

11. A reactor as claimed in claim 4 wherein the capillary plug is constructed by drilling a plurality of parallel fine holes in a stainless steel disk.

12. A reactor as claimed in claim 4 wherein the capillary plug is constructed of a plurality of parallel fine stainless steel tubes arranged in a bundle.

13. A reactor as claimed in claim 4 wherein the heater element is an electrical resistance heater.

14. A reactor as claimed in claim 13 wherein the electrical heater is regulated by a thermocouple.

15. A reactor as claimed in claim 14 wherein the substrate is held in place at the broad upper end of the conical diffuser chamber by one or more quartz pins.

16. A reactor as claimed in claim 13 wherein the resistance heater comprises a wound heating element formed of nichrome metal, the element being enclosed in heat reflecting mirror, and a ceramic heater housing.

17. A reactor as claimed in claim 16 wherein the heater is enclosed in a quartz tube.

* * * * *